United States Patent [19]
Fukuyama et al.

[11] Patent Number: 4,475,230
[45] Date of Patent: Oct. 2, 1984

[54] HEARING AID

[75] Inventors: Kunihiko Fukuyama, Hino; Takuo Yamamoto, Fussa; Hiromi Masaike, Machida, all of Japan

[73] Assignee: Rion Kabushiki Kaisha, Japan

[21] Appl. No.: 403,265

[22] Filed: Jul. 29, 1982

[30] Foreign Application Priority Data

Aug. 7, 1981 [JP] Japan .................................. 56-123884

[51] Int. Cl.$^3$ ............................................ H03G 11/00
[52] U.S. Cl. ........................................ 381/68; 381/74; 381/107
[58] Field of Search .................... 381/68, 86, 104, 107, 381/108, 102, 95, 96, 56, 57, 74, 72; 455/219, 234

[56] References Cited

U.S. PATENT DOCUMENTS 3,571,529  3/1971  Gharbi et al. .......................... 381/68
4,297,527  10/1981  Pate ...................................... 381/107

Primary Examiner—Gene Z. Rubinson
Assistant Examiner—James L. Dwyer
Attorney, Agent, or Firm—Beveridge, De Grandi & Kline

[57] ABSTRACT

In a hearing aid, when the input sound pressure to the microphone exceeds a preset level for a preset period of time, a control signal is produced to automatically decrease the maximum output sound level, thereby decreasing the overload to the user.

5 Claims, 8 Drawing Figures

F I G. 2
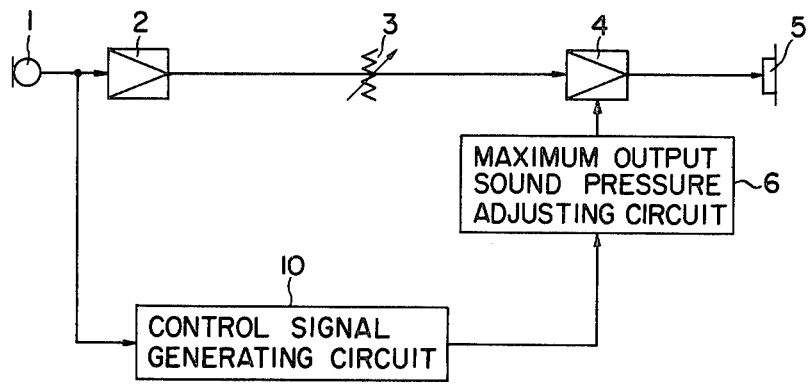
F I G. 3
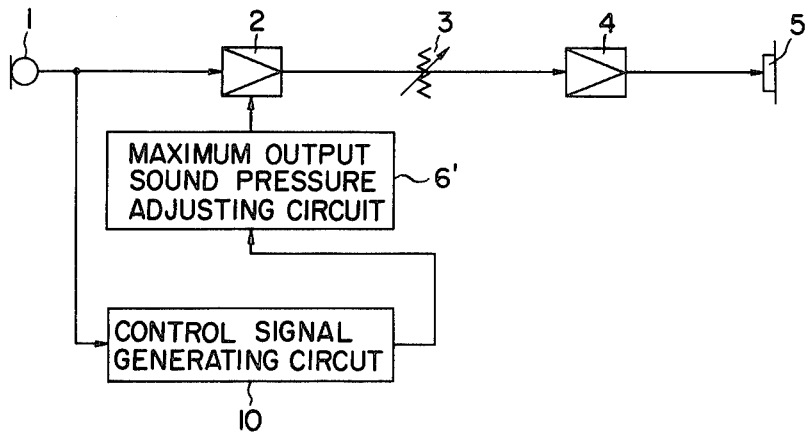

HEARING AID

BACKGROUND OF THE INVENTION

This invention relates to hearing aids, and more particularly to an improvement to hearing aids.

A conventional hearing aid has not only the function of electrically amplifying an input sound to a microphone into a louder sound which is produced as an output from an earphone, but also the function of adjusting the output sound level to the hearing characteristic of a person having a hearing loss. Alternatively, a hearing aid may be designed so that its amplification is adjustable only over a small range, to provide a hearing aid with correct amplification for use by each person.

FIG. 1 is a block diagram showing the fundamental arrangement of a conventional hearing aid. An electrical signal from a microphone 1 is amplified by a preamplifier circuit 2. The output of the preamplifier circuit 2 is controlled by a variable resistor 3, the output of which is amplified by a main amplifier 4 to the extent that it can drive an ear-phone 5. Thus, the electrical signal from the microphone is converted into an acoustic signal. In some conventional hearing aids, the preamplifier circuit 2 has the function of varying the amplification band width according to a characteristic of the input signal from the microphone, so that the articulation index is maintained substantially unchanged when noise is present.

However, the conventional hearing aid suffers from difficulties when a loud microphone input sound occurs causing a loud output sound from the hearing aid. In this case, the microphone input sound is much louder than that which occurs when the hearing aid user hears conversational sounds or environmental sounds, thus causing maximum output sound. It goes without saying that the relation between the hearing characteristic of the hearing aid user and the maximum output sound obtained from the hearing aid is intentionally designed and controlled. If, when a high level microphone input sound occurs, such as a noise, the maximum output sound lasts for only an extremely short period of time, troubles are scarcely caused. However, when the maximum output sound lasts for several seconds to several tens of seconds, the energy of sound is accumulated in the user of the hearing aid, to cause the user to say "The hearing aid is noisy", with the result that he may refuse to use the hearing aid. The forcible use of a hearing aid is a great burden to the user. The above-described drawback may be eliminated by employing a hearing aid in which the maximum output sound is low so that no large burden is caused even when the maximum output sound lasts for a relatively long time. However, when such a hearing aid is used under ordinary conditions, the average sound level is excessively low, and therefore the reproduced sound is unsatisfactory or unclear. A method has been considered in which, when the output sound is noisy, a manual switch may be operated to decrease the maximum output sound level, thereby avoiding overloading. In general, a person having a hearing loss who wears a hearing aid which has been adjusted correctly merely gets sounds at the articulation index, in many cases, lower than that which the ordinary person gets. In the case where a person having a hearing loss intends to improve his low articulation index by enduring the overload, or where such a person intends to hear conversations under loud noises, often considers that he cannot hear clearly because of his hearing loss, even if the ordinary person cannot hear sufficiently in such a case. This further increases the load to the ears of the person with hearing loss. On the other hand, the sound which is heard when the surroundings are noisy, to the extent that the ordinary person cannot hear clearly, is the noise itself. Even under such a condition, the user of the hearing aid should hear conversations.

SUMMARY OF THE INVENTION

An object of this invention is to provide a hearing aid in which the above-described difficulties that accompany a conventional hearing aid have been eliminated.

The foregoing object and other objects of the invention have been achieved by the provision of a hearing aid having a preamplifier circuit for amplifying an electrical signal from a microphone, a variable resistor for controlling the amplitude of the electrical signal thus amplified, a main amplifier circuit for further amplifying the electrical signal, and an ear-phone for converting the electrical signal thus amplified into an acoustic signal; which, according to the invention, further comprises: a control signal generating circuit for generating a control signal when the input signal to the microphone exceeds a preset level for a preset period of time; and a maximum output sound level adjusting circuit for suppressing, with the aid of the control signal from the control signal generating circuit, the output sound level corresponding to the electrical signal from the microphone.

The nature, principle and utility of the invention are more apparent from the following detailed description when read in conjunctin with the accompanying drawings, in which like parts are designated by like reference numerals or characters.

BRIEF DESCRIPTION OF THE DRAWINGS

In the accompanying drawings:

FIGS. 2 through 4 are block diagrams showing first, second and third examples of a hearing aid according to this invention, respectively;

DETAILED DESCRIPTION OF THE INVENTION

A first example of a hearing aid according to this invention will be described with reference to FIG. 2.

Figure 1:
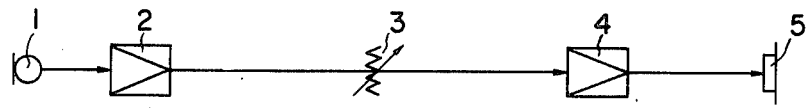
FIG. 1 is a block diagram showing the fundamental arrangement of a conventional hearing aid.

As is apparent from the comparison of FIG. 2 with FIG. 1, the first example of the hearing aid according to the invention can be obtained by modifying the conventional hearing aid of FIG. 1 as follows: The fundamental arrangement of the conventional hearing aid in which the output signal from the microphone 1 is applied through the preamplifier circuit 2, the variable resistor 3 and the main amplifier 4 to the ear-phone 5 so that the electrical signal is converted into an acoustic signal, is so modified that a control signal generating circuit 10 is connected to the microphone 1 and a maximum output sound level adjusting circuit 6 is connected between the output of the control signal generating circuit 10 and the main amplifier 4 as shown in FIG. 2. The control signal generating circuit 10 operates to generate a control signal when the output signal from the microphone exceeds a preset sound level for a preset period of time. The maximum output sound level adjusting circuit 6 operates to adjust the electrical signal (sound level) with the aid of the control signal from circuit 10.

When, in the hearing aid thus constructed, a high level electrical signal from the microphone 1 exceeds the sound level (for instance 90 dB S.P.L. (sound pressure level) at which the output level of the hearing aid becomes maximum) for the period of time (several seconds to several tens of seconds) both of which are preset in the control signal generating circuit 10, the control signal generating circuit 10 produces a control signal. The control signal is applied to the maximum output sound level adjusting circuit 6 connected to the main amplifier 4, so that the maximum sound level is decreased and a limited acoustic output is provided through the ear-phone.

In the above-described first example, the control signal generating circuit receives the output signal directly from the microphone 1; however, the same effect can be obtained by connecting the control signal generating circuit 10 to the output of the preamplifier circuit 2 so as to receive the output signal which has been amplified thereby.

FIG. 3 shows a second example of a hearing aid according to the invention. In the second example, a maximum output sound level adjusting circuit 6' is connected to the preamplifier circuit 2.

When a high level electrical signal from the microphone 1 exceeds the sound level and the period of time which are preset in the control signal generating circuit 10, circuit 10 produces a control signal. The control signal is applied to the maximum output sound level adjusting circuit 6' which is connected to the preamplifier circuit 2, so that the maximum output sound level is decreased. Therefore, similar to the first example, a limited sound is produced by the ear-phone with the aid of the variable resistor 3 and the main amplifier circuit 4. Thus, the second example has the same effect as the first example.

Figure 4:
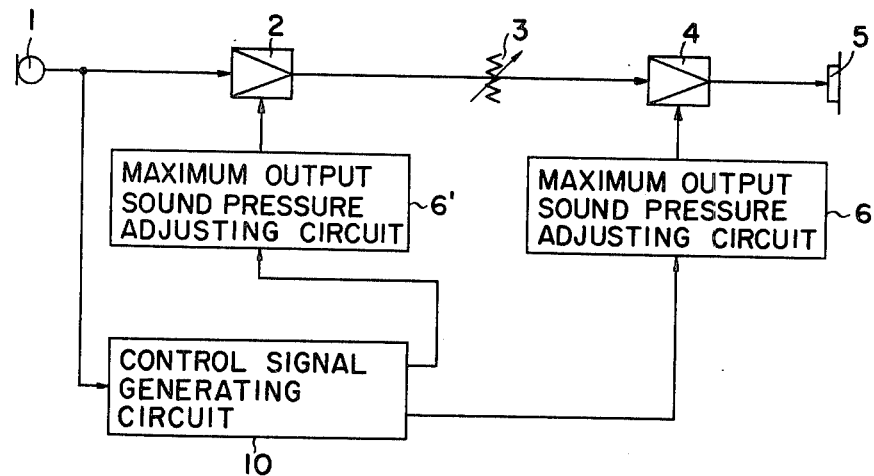

A third example of a hearing aid according to the invention is shown in FIG. 4. In this example, a maximum output sound level adjusting circuit 6 is connected to the main amplifier circuit 4, and a maximum output sound level adjusting circuit 6' is connected to the preamplifier circuit 2. The maximum output sound level adjusting effect of the third example is higher than that of the first or second example.

When a high level electrical signal from the microphone 1 exceeds the sound level and the period of time which have been set in the control signal generating circuit 10, circuit 10 produces a control signal. In this connection, the function of distinguishing noise and voice from each other is given to the control signal generating circuit 10, so that the latter can provide the control signal more readily in the case of a noise. In general, the noise is continuous, while the voice is intermittent. This difference is utilized to distinguish noise and voice from each other. Further, noise is different from voice in spectrum. Therefore, noise and voice can be distinguished from each other by detecting a high frequency and/or a low frequency which are rarely included in a voice. In the case where a high level electrical signal from the microphone 1 is representative of a voice, even when the electrical signal exceeds the sound level and the period of time which have been set, it is rather difficult for the control signal generating circuit to generate the control signal, because the electrical signal in this case is a necessary one.

Figure 5:
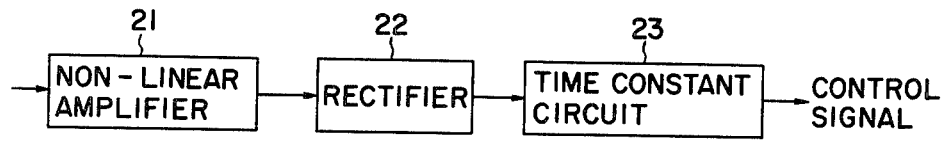
FIG. 5 is a block diagram showing one example of a control signal generating circuit employed in these examples.

FIG. 5 shows one example of a control signal generating circuit having the above-described noise and voice distinguishing function. In this example, noise and voice are distinguished from each other by determining whether the input sound level is continuous or intermittent. The control signal is used to recognize, instead of the average value of the input sound level, the variation thereof. In order to detect the discontinuity of the level instead of the average value of the level, the electrical signal from the microphone is amplified by a non-linear amplifier 21 having a rise and release time of several seconds to several tens of seconds and is rectified by a rectifier circuit 22. The output of the rectifier circuit 22 is applied to a time constant circuit 23, which operates to increase the rise time and decrease the release time. The control signal thus obtained is one which is weighted according to the degree of continuity or intermittence of the original input sound.

Figure 6:
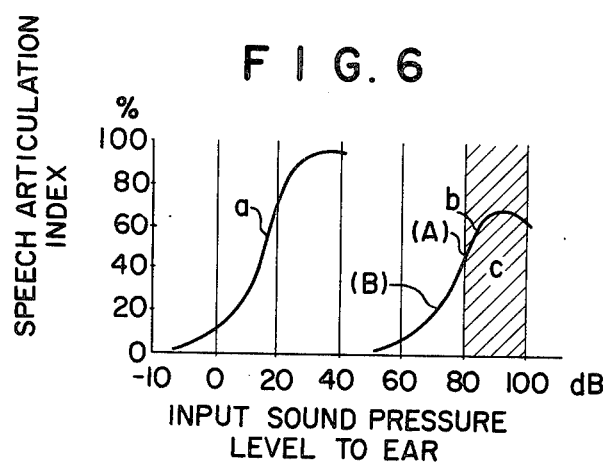
FIG. 6 is a graphical representation indicating sound level with speech articulation index.

Let us consider the articulation index in the case where a person having sensory-neural hearing loss experiences a complementary phenomenon peculiar thereto. In order to allow a person having a hearing loss to hear, it is necessary to increase the input sound level as much as his hearing loss. When the input sound level is increased more, the articulation index to a voice or the like is increased. However, if the level of the input sound to the ear is merely increased in order to increase the articulation index, then the person with a hearing loss will say "My ears are resounded", "Noisy" or "My ears ache" because of the complementry phenomenon which occurs when the sound pressure changes more greatly than is experienced by a person not having a hearing loss. Thus, although the person with sensory-neural hearing loss cannot hear without increasing the input sound level as much as his hearing loss, he feels uncomfortable with a sound whose level is larger than a certain value. That is, most people with sensory-neural hearing loss have a much smaller dynamic hearing range than do people with normal hearing. The sound level which provides the maximum articulation index is not always a comfortable hearing sound level, and it may be an uncomfortable sound level. This relation is shown by FIG. 6, in which the vertical axis represents speech articulation indexes and the horizontal axis represents input sound levels to the ears. Curve a of FIG. 6 indicates sound level with speech articulation index in the case of a person with normal hearing. When the sound level is 35 to 40 dB, the speech articulation index is substantially 100%. Curve b of FIG. 6 is a corresponding curve for a person with hearing loss. In this case, the articulation index is maximum when the sound level is about 90 dB, and the uncomfortable range is depicted by shaded part c which extends from the 80 dB point. If such a person wants to hear more clearly, he must be patient with regard to "noisiness". It goes without saying that the hearing aid should be so adjusted that, when the input sound is normal, the output does not exceed the discomfort threshold. However, since it is required that the hearing aid be set so that the speech articulation index is as high as possible, the sound level is set close to the discomfort threshold. Accordingly, in the case of a large noise, the person will hear a continuous sound close to the discomfort threshold. In this invention, in the case of a noise whose sound level is close to that at point (A) in FIG. 6, the control signal generating circuit 10 is caused to produce a control signal, so that the input sound level is decreased to point (B) by the maximum output sound level adjusting circuit which is coupled to the main amplifier circuit and/or the preamplifier circuit. When the input sound level is decreased to point (B), the person cannot hear adequately; however, it is unnecessary for him to hear the noise, and in such case he can give a rest to his ears. When the noise is decreased, the input sound level is increased to point (A) again, so that the speech articulation index is increased. This will be described from another angle. That is, the relationships beween noise levels, hearing aid output sound levels and time will be described with reference to FIGS. 7 and 8.

Figure 7:
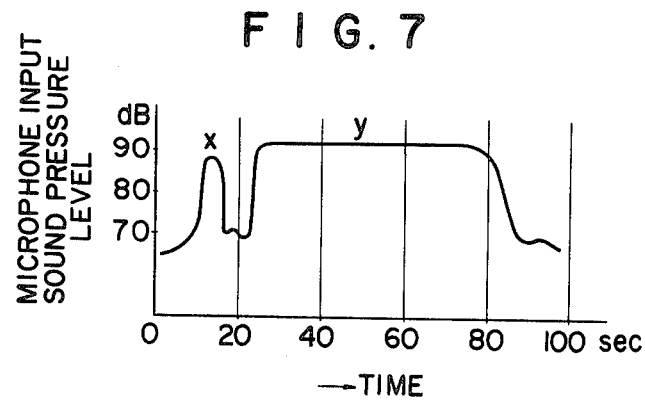
FIG. 7 is a graphical representation indicating microphone input sound level with time.
Figure 8:
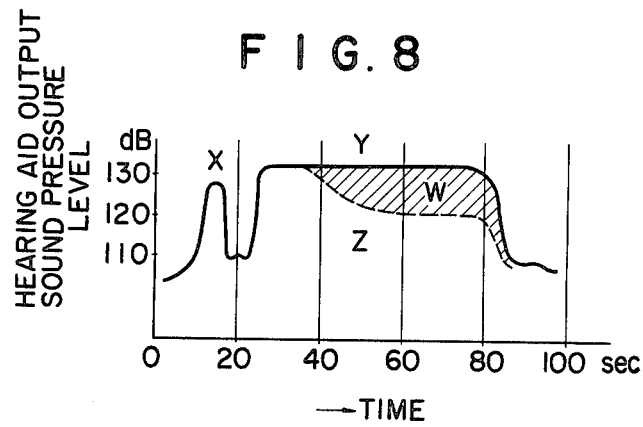
FIG. 8 is a graphical representation indicating hearing aid sound level with time.

In FIG. 7, the vertical axis represents microphone input sound levels, while the horizontal axis represents time, so as to indicate input sound level with time. In FIG. 8, the vertical axis represents hearing aid output sound levels, while the horizontal axis represents time, so as to indicate hearing aid output sound level with time. Part x of the curve in FIG. 7 represents the rise of an input sound level for a short period of time, and therefore part x results in the output sound level part X of the curve in FIG. 8. On the other hand, part y of the curve in FIG. 7, in which the input sound level is sustained for a relatively long time, results in output sound level corresponding to part Y in FIG. 8 in the case of a conventional hearing aid. However, in the case of the hearing aid of the invention, the part y of FIG. 7 causes part Z of FIG. 8, indicated by the dotted line. Accordingly, the output sound level is high once, but in several seconds to several tens of seconds the output level is decreased to the dotted curve Z even if the input level is constant. That is, the output level is suppressed as much as the shaded part W.

As is apparent from the above description, in the hearing aid according to the invention, the output sound level is adjusted by means which automatically saturates the acoustic gain and/or amplifier circuit according to the predetermined conditions in response to an environmental noise. Therefore, in the hearing aid according to the invention, the output sound will not become noisy and will not overload the ear of the person with hearing loss. That is, the user will not be disabled by the use of the hearing aid.

What is claimed is:

1. A hearing aid comprising:
   a preamplifier circuit for amplifying an electrical signal from a microphone;
   a variable resistor for controlling the amplitude of the amplified electrical signal;
   a main amplifier for further amplifying the controlled electrical signal;
   an ear-phone for converting the further amplified electrical signal into an output sound signal;
   a control signal generating circuit for generating a control signal when the magnitude of the microphone electrical signal indicates that for at least a preset period of time in the range of from several seconds to several tens of seconds the input sound signal to the microphone exceeds a preset sound level; and
   a maximum output sound level adjusting circuit responsive to the control signal from said control signal generating circuit for controlling the amplification of at least one of said preamplifier circuit and said main amplifier to suppress the output sound signal level corresponding to the electrical signal from the microphone.

2. A hearing aid as claimed in claim 1, in which said maximum output sound level adjusting circuit is connected to control the amplification of said main amplifier circuit.

3. A hearing aid as claimed in claim 1, in which said maximum output sound level adjusting circuit is connected to control the amplification of said preamplifier circuit.

4. A hearing aid as claimed in claim 1, further comprising a second maximum output sound level adjusting circuit, said maximum output sound level adjusting circuit and said second maximum output sound level adjusting circuit being connected to control the amplification of said preamplifier circuit and said main amplifier curcuit, respectively.

5. A hearing aid as claimed in claim 1, in which said control signal generating circuit includes means for distinguishing noise signals from voice signals.

* * * * *